(12) United States Patent
Landolt

(10) Patent No.: US 9,355,742 B2
(45) Date of Patent: May 31, 2016

(54) SAMPLING DEVICE WITH TIME-INTERLEAVED OPTICAL CLOCKING

(71) Applicant: Rohde & Schwarz GmbH & Co. KG, Munich (DE)

(72) Inventor: Oliver Landolt, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/398,123

(22) PCT Filed: Apr. 23, 2013

(86) PCT No.: PCT/EP2013/058362
§ 371 (c)(1),
(2) Date: Oct. 30, 2014

(87) PCT Pub. No.: WO2013/164221
PCT Pub. Date: Nov. 7, 2013

(65) Prior Publication Data
US 2015/0130513 A1 May 14, 2015

(30) Foreign Application Priority Data

Apr. 30, 2012 (EP) .................................... 12166132
May 11, 2012 (EP) .................................... 12167613

(51) Int. Cl.
*G11C 27/02* (2006.01)
*H03K 5/00* (2006.01)
(Continued)

(52) U.S. Cl.
CPC ............... *G11C 27/02* (2013.01); *G02B 6/125* (2013.01); *G02F 7/00* (2013.01); *G11C 27/024* (2013.01); *H03K 3/42* (2013.01); *H03M 1/1245* (2013.01); *G02B 6/2861* (2013.01); *G02B 2006/1215* (2013.01); *G02B 2006/12147* (2013.01); *G02B 2006/12154* (2013.01); *G11C 13/04* (2013.01); *H03M 1/1215* (2013.01)

(58) Field of Classification Search
CPC .... G11C 27/026; G11C 27/024; G11C 27/02; G11C 27/00; G09G 3/3688

USPC ...................................................... 327/91–96
See application file for complete search history.

(56) References Cited

U.S. PATENT DOCUMENTS 6,522,222 B1 * 2/2003 Pchelnikov et al. ........... 333/161
2005/0201455 A1 * 9/2005 Wilson ........................... 375/232
(Continued)

FOREIGN PATENT DOCUMENTS

DE   102010025782 A1   1/2012
EP       1279974 A2     1/2013

OTHER PUBLICATIONS

Doi, et al., "Analysis and Design of Low Loss and Low Mode-Shift Integrated Optical Waveguides Using Finite-Difference Time-Domain Method", IEICE Transactions in Electronics, vol. E80-C, No. 5, May 1997.
Jacobs, et al., "Optically Clocked Track-and-Hold for High-Speed High-Resolution Analog-to-Digital Conversion", IEEE MWP, Apr. 2004.

(Continued)

*Primary Examiner* — Diana J Cheng
(74) *Attorney, Agent, or Firm* — Potomac Technology Law, LLC

(57) ABSTRACT

A sampling device comprising a first input port and a second input port, wherein an input-signal is fed to the first input port and wherein an optical clock signal is fed to the second input port. The sampling device comprises a plurality of track and hold units, wherein each of the plurality of track and hold units is connected to the first input port. The plurality of the track and hold units is further connected to the second input port through an optical waveguide in such a manner that the plurality of tack and hold units operate in a time-interleaved mode.

20 Claims, 7 Drawing Sheets

(51) Int. Cl.

| | |
|---|---|
| *G02F 7/00* | (2006.01) |
| *G02B 6/125* | (2006.01) |
| *H03K 3/42* | (2006.01) |
| *H03M 1/12* | (2006.01) |
| *G11C 13/04* | (2006.01) |
| *G02B 6/28* | (2006.01) |
| *G02B 6/12* | (2006.01) |

(56) References Cited

U.S. PATENT DOCUMENTS

2010/0277354 A1 11/2010 Lee et al.
2013/0105669 A1 5/2013 Landolt

OTHER PUBLICATIONS

Jenq, "Digital Spectra of Nonuniformly Sampled Signals: A Robust Sampling Time Offset Estimation Algorithm for High-Speed Waveform Digitizers Using Interleaving", IEEE Transactions on Instrumentation and Measurement, vol. 39, No. 1, Feb. 1990.

Tang, et al., "Optical Coding Scheme for All-Optical Analog-to-Digital Conversion Using Asymmetrical Y-Branch Waveguide", Optics Communications, 284, 2011.

Yong, et al., "Design and Analysis of Equal Power Divider Using 4-Branch Waveguide", IEEE Journal of Quantum Electronics, vol. 41, No. 9, Sep. 2005.

\* cited by examiner ns at this page.

SAMPLING DEVICE WITH TIME-INTERLEAVED OPTICAL CLOCKING

FIELD

The invention relates to a sampling device which comprises a plurality of track-and-hold-units that are operated in a time-interleaved mode.

BACKGROUND

The increasing need for wideband communication systems drives an increasing demand for suitable measurement systems. For analyzing those communication systems, the obtain a measurement system having such a good jitter performance, the whole clock tree has to be stabilized.

The publication E. W. Jacobs et al., "Optically clocked track-and-hold for high-speed, high-resolution analog-to-digital conversion," IEEE MWP '04, 2004, pages 190-192, describes a track-and-hold-unit that can be used within an analogue-to-digital-converter, wherein the track-and-hold-unit receives an optical clock. The track-and-hold-unit therefore comprises two photodiodes that are used for generating an electrical current which is fed into a diode circuit thereby turning off a lower current from two current sources. Whenever an optical pulse is received by the two photodiodes, a high frequency signal is kept constant at the output of the diode bridge.

It is a drawback of the publication that the sampling rate is limited, because the necessary hold-times for the analog/digital-converter cannot be reduced anymore.

What is needed, therefore, is an approach for a sampling device that has a very high sampling rate as well as a good jitter performance.

Some Example Embodiments

Embodiments of the present invention advantageously address the foregoing requirements and needs, as well as others, by providing an approach for a sampling device that has a very high sampling rate as well as a good jitter performance.

According to example embodiments of the present invention, the sampling device comprises a first input port and a second input port, wherein an input-signal is fed to the first input port and wherein an optical clock signal is fed to the second input port. The sampling device further comprises a plurality of track-and-hold-units, wherein each of the plurality of the track-and-hold-units is connected to the first input port and wherein the plurality of the track-and-hold-units is also connected to the second input port through an optical waveguide in such a manner that the plurality of the track-and-hold-units operate in a time-interleaved mode. For example, a plurality of track-and-hold-units are used and a single optical clock signal can be forwarded to those plurality of track-and-hold-units, so that only one light source is needed. Further, the plurality of the track-and-hold-units may advantageously operate in a time-interleaved mode. This ensures that the input-signal is captured by the plurality of the track-and-hold-units at different times, thereby allowing each of the plurality of the track-and-hold-units to store a part of the input-signal for a longer time.

According to further example embodiments of the present invention, the optical waveguide comprises delay units, wherein the delay units delay the optical clock signal by a period of $\Delta t = 1/(N f_{clk})$, wherein $f_{clk}$ is the frequency of the optical clock signal and wherein N is the number of the plurality of the track-and-hold-units. Therefore, each track-and-hold-unit has N times more time to hold a part of the input-signal for the following analogue-to-digital-conversion circuit, thereby increasing the sampling frequency by the factor of N.

In accordance with one embodiment, each delay unit is a part of the optical waveguide and has the shape of a meander and/or has segments that are parallel to each other, and each delay unit has other segments that connect the parallel segments to each other, wherein the other segments are round having a diameter that is equal or larger than the distance between the two parallel segments. The use of such delay units, that have the shape of a meander having parallel segments as well as the use of the other round segments connecting the parallel segments to each other, ensure that the power loss of the optical clock signal is minimized. However, no corners or other disadvantageous changeovers are used within the delay units.

In accordance with a further embodiment, the delay unit is a part of the optical waveguide and this part of the optical waveguide, which forms the delay unit, has the shape of a spiral, wherein an inner segment of the delay unit which is also an inner segment of the spiral is lead to the outside within a straight line, thereby crossing the other segments at an angle of about 90°. If an angle of approximately 90° is maintained, it is possible that the optical clock signal in different segments of the optical waveguide can cross itself without interfering itself. Therefore, the optical waveguide can be applied very easily.

In accordance with a further embodiment, the optical waveguide comprises N−1 optical power dividers, wherein N is the number of the plurality of the track-and-hold-units, wherein each optical power divider splits the optical waveguide into a first branch and a second branch, and/or the ratio of the signal power at each branch can be selected by adjusting the divergence angle of the first branch and the divergence angle of the second branch with respect to an incoming signal line of the optical power divider. The use of such optical power dividers is advantageous, because the jitter performance is not degraded. By way of example, the signal power at each branch can be adjusted, whereby each of the plurality of the track-and-hold-units receives the same signal level.

In accordance with a further embodiment, the N−1 optical power dividers are connected in the structure of a binary tree whose root is located at the second input port and whose N terminal branches connect to the N track-and-hold units. The terminal branches may also be the leaf nodes of the binary tree. It should be noted, that all kinds of binary trees can be used, like a perfect binary tree or a complete binary tree.

In accordance with a further embodiment, at least one delay unit is arranged within the second branch of each of the N−1 optical power dividers. This ensures that every track-and-hold-unit operates at a different time, so that every track-and-hold-unit captures a different part of the input-signal.

In accordance with a further embodiment, the depths of all branches of the tree-structure comprising all descendants of the first optical power divider are the same and/or the number of the delay units that are ranged within the second branch of every optical power divider equals the number of the track-and-hold-units that are connected as descendants to that respective branch and/or the first branch of every optical power divider excludes the delay unit(s). This ensures that all N−1 optical power dividers are arranged symmetrically so that the only difference in the various branches is the number of the delay units. This allows that the signal power can be adjusted more easily within the N−1 optical power dividers, so that each of the plurality of the track-and-hold-units receives approximately the same signal level.

According to further example embodiments of the present invention, the sampling device comprises a plurality of opto-electronic flip-flops, wherein each of the plurality of the opto-electronic flip-flops transforms the optical clock signal into an electrical clock signal, wherein each of the plurality of the opto-electronic flip-flops connects each of the track-and-hold-units to the optical waveguide. This ensures that the electrical clock signal has a duty cycle of approximately 50%, wherein the light pulses of the optical clock signal are much smaller.

In accordance with a further embodiment, the optical waveguide is made of a layer of germanium or $SiO_2$ and/or the optical waveguide, the optical power splitters and the delay units are made of germanium or $SiO_2$ and are arranged on a first part of the wafer and if the plurality of the track-and-hold-units, and the opto-electronic flip-flops are made of SiGe and are arranged on a second part of the wafer, and the opto-electric flip-flop comprises a photodiode that is arranged in between the two parts of the wafer. This ensures that the wafer can be used by the optic elements as well by the electronic elements. This allows that all of the aforementioned components can be integrated within a single chip, thereby reducing the unit costs.

In accordance with a further embodiment, a mode locked laser is used to generate the optical clock signal and the mode locked laser is connected through an optical fiber to the second input port. A mode locked laser has very good jitter performance as well as an output power on the order of 30 mW.

BRIEF DESCRIPTION OF THE DRAWINGS

Different example embodiments of the present invention are described by the way of example with reference to the drawings, without limitation. Identical elements have the same reference signs. The figures in the drawings show.

DETAILED DESCRIPTION OF EXAMPLE EMBODIMENTS

An approach for a sampling device that has a very high sampling rate as well as a good jitter performance, is described.

Figure 1:
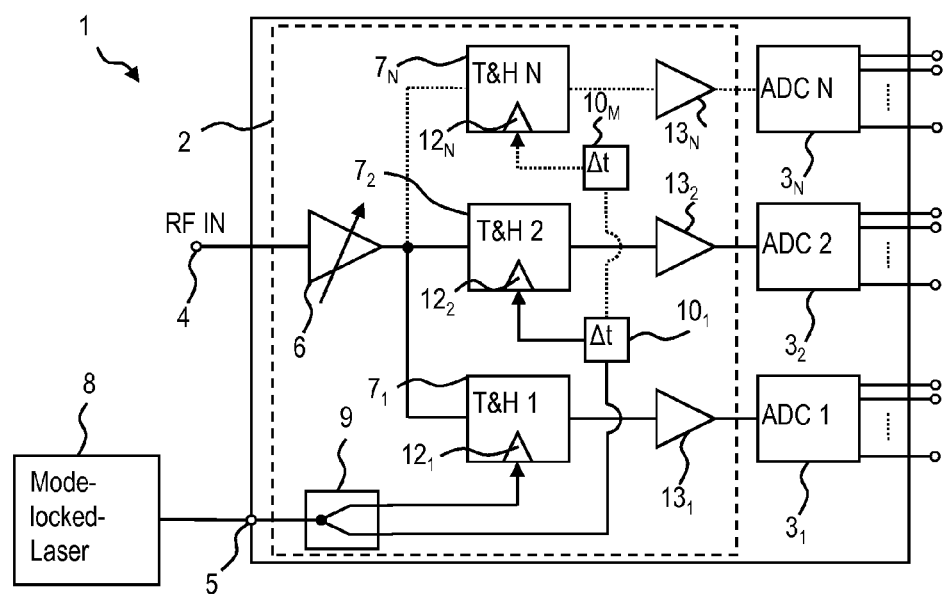
FIG. 1 illustrates a high speed sampling unit, which includes a sampling device that comprises a plurality of track-and-hold-units which are operated in a time-interleaved mode, in accordance with example embodiments of the present invention.

FIG. 1 shows a high-speed sampling unit 1 comprising the sampling device 2, which in turn comprises track-and-hold-units $7_1$, $7_2$ to $7_N$ which are operated in a time-interleaved mode, in accordance with example embodiments of the present invention. In some cases, the high-speed sampling unit 1 can be integrated within a single chip or ASIC. However, it is also possible that the sampling device 2 can be integrated on a chip of its own while the analog/digital-converters $3_1$, $3_2$ to $3_N$ are located on separate chips. It should be noted, that the analog/digital-converters $3_1$, $3_2$ to $3_N$ are only incorporated within FIG. 1 for a better understanding and that they are not a necessary part of embodiments of the invention. The sampling device 2 further comprises a first input port 4 and a second input port 5. An electrical input-signal, i.e. a RF-signal, is fed to the first input port 4. The RF-signal is a high-frequency signal having a bandwidth of approximately up to 30 GHz and above.

The RF-signal is then amplified by at least one amplifier 6. However, if N is small, for example four or eight, the RF-signal does not need to be amplified. According to one embodiment, the amplification factor of the at least one amplifier 6 is adjustable. The amplified RF-signal is then fed to each of a plurality of the track-and-hold-units $7_1$, $7_2$ to $7_N$. The amplified RF-signal can therefore be split up for example by using a 3-dB hybrid-coupler. It is also possible to abstain from using a 3-dB hybrid-coupler within a chip, because the signal lines should be short enough.

Furthermore, the high-speed sampling unit 1 comprises an optical clock source 8. The optical clock source is preferably a mode locked laser 8. The mode locked laser 8 is difficult to integrate within a chip together with the other components of the high-speed sampling unit 1. The mode locked laser 8 generates an optical clock signal having a frequency $f_{clk}$ of, for example, 10 GHz. The energy for each pulse exceeds for example 3 pJ and the timing jitter is smaller than 20 fs RMS.

By way of example, the sampling device 2 comprises the at least one amplifier 6, the plurality of the track-and-hold-units $7_1$, $7_2$ to $7_N$ as well as at least one optical power divider 9 and at least one delay unit $10_1$, $10_2$.

According to a further embodiment, the mode locked laser 8 is connected to the second input port by using an optical fiber. Within the sampling device 2 which can also be within a chip, an optical waveguide 11 is used to lead the optical clock signal to each of the plurality of the track-and-hold-units $7_1$, $7_2$ to $7_N$. By way of example, the optical clock signal is fed to the plurality of the track-and-hold-units $7_1$, $7_2$ to $7_N$ in such a manner that the plurality of the track-and-hold-units are operated in a time-interleaved mode.

The second input port 5 which is connected to the optical waveguide 11 is connected to a first optical power divider 9. A first branch of the first optical power divider is connected to the first track-and-hold-unit $7_1$. A second branch of the first optical power divider 9 is connected to a first delay unit $10_1$. The first delay unit $10_1$ is further connected to a another delay unit $10_M$, wherein M≥1 and M∈ℕ. Within the first delay unit $10_1$ there is also another optical power divider which splits up the optical clock signal into a signal that is fed to the second track-and-hold-unit $7_2$. Another signal of the another optical power divider is then fed to the other track-and-hold-units $7_N$, wherein N≥2 and N∈ℕ.

It should also be noted that all branches which extend from every optical power divider 9 still belong to the optical waveguide 11.

By way of example, every delay unit $10_1$ to $10_M$ delays the optical clock signal by a period $\Delta t=1/(Nf_{clk})$, wherein $f_{clk}$ is the frequency of the optical clock signal. If the number for N is three for example, each delay unit $10_1$ to $10_M$ delays the optical clock signal by the factor of ⅓ period. This means that the track-and-hold-units $7_1$, $7_2$ to $7_N$ can store a part of the RF-signal for a whole clock period, thereby ensuring that the RF-signal is sampled with a frequency that is three times higher than the frequency of the optical clock signal.

According to a further embodiment, each of the plurality of the track-and-hold-units $7_1$, $7_2$ to $7_N$ comprises a plurality of opto-electronic flip-flops $12_1$, $12_2$ to $12_N$ which transform the optical clock signal into an electrical clock signal. The plurality of the opto-electronic flip-flops $12_1$, $12_2$ to $12_N$ therefore connect each of the track-and-hold-units $7_1$, $7_2$ to $7_N$ to the optical waveguide 11. The plurality of the opto-electronic flip-flops $12_1$, $12_2$ to $12_N$ also enhance the duty cycle of the electrical clock signal to approximately 50%. The opto-electronic flip-flops $12_1$, $12_2$ to $12_N$ can be integrated within the track-and-hold-units $7_1$, $7_2$ to $7_N$, but they can also be separated from the respective track-and-hold-units $7_1$, $7_2$ to $7_N$. Thus they can be integrated somewhere in the sampling device 2.

According to a further embodiment, the output of each of the plurality of the track-and-hold-units $7_1$, $7_2$ to $7_N$ is connected to an amplifier $13_1$, $13_2$ to $13_N$. The amplifiers $13_1$, $13_2$ to $13_N$ drive the inputs of the analog/digital converters. Furthermore, the analog/digital-converters $3_1$, $3_2$ to $3_N$ are arranged outside of the chip, because the chip may not be large enough. Each of the analog/digital-converters $3_1$, $3_2$ to $3_N$ has a plurality of parallel output ports which can be used for a high-speed data transfer.

Figure 2:
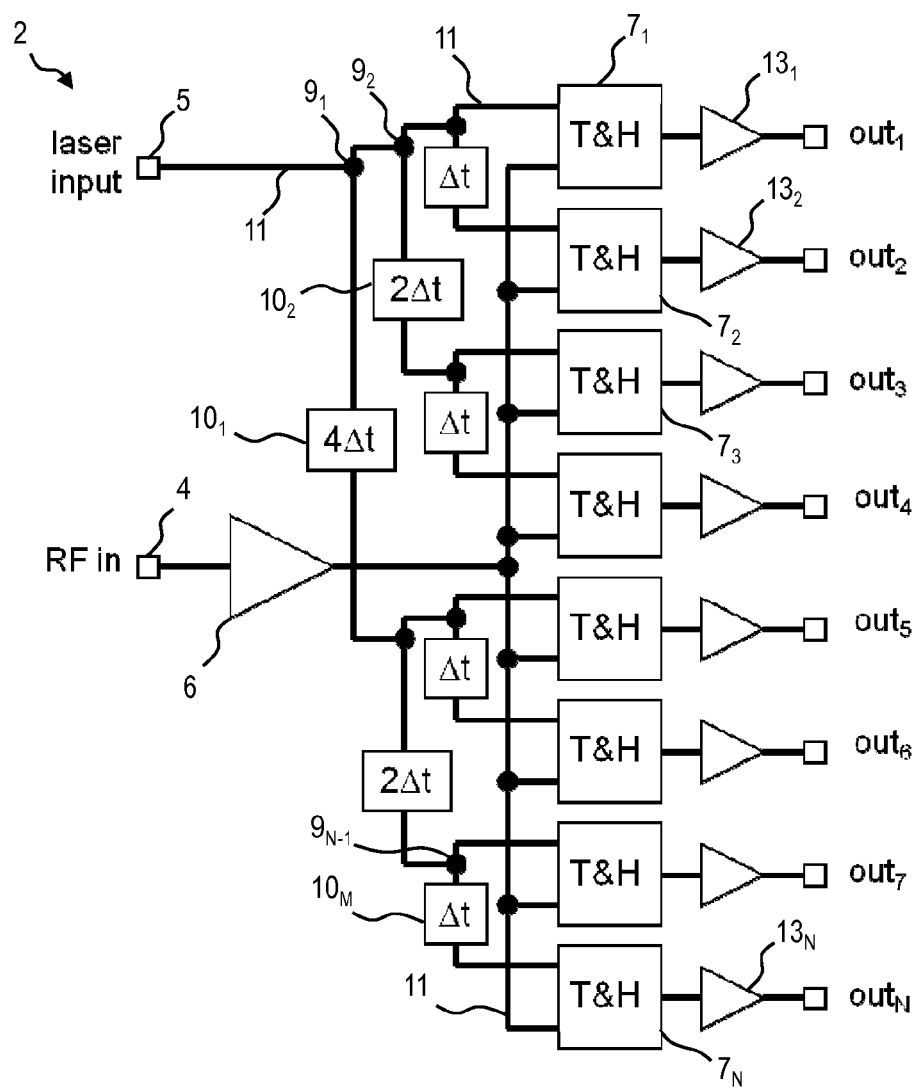
FIG. 2 illustrates a sampling device according to an example embodiment of the present invention.

FIG. 2 shows a sampling device 2 according to an example embodiment of the present invention. The sampling device 2 comprises a plurality of track-and-hold-units $7_1$, $7_2$ to $7_N$. In this case the interleaving factor N equals eight, which also means that there are eight track-and-hold-units $7_1$, $7_2$ to $7_N$. It can also be seen that there is a plurality of delay units $10_1$ to $10_M$. Each delay unit $10_1$, $10_M$ is a part of the optical waveguide 11 which is explained in detail below.

The optical waveguide 11 further comprises N−1 optical power dividers $9_1$ to $9_{N-1}$ wherein N is the interleaving factor as well as the number of the plurality of the track-and-hold-units $7_1$, $7_2$ to $7_N$. Each optical power divider $9_1$ to $9_{N-1}$ splits the optical waveguide 11 into a first branch and into a second branch. If the optical waveguide 11 is nearly lossless, each branch should get half the incoming optical power. In practice, the optical waveguide may have substantial losses, whereby a larger attenuation will occur on a branch with a large delay compared to a branch with a small delay. In this case, more power may be provided to the branch with a large delay so that the power at the output of each branch will be substantially equal. The ratio of the signal power at each branch can be selected by adjusting the divergence angle of the first branch and the divergence angle of the second branch with respect to the incoming signal line of the respective optical power divider $9_1$ to $9_{N-1}$. These details will also be explained below.

By way of example, the ratio of the signal power of all N−1 optical power dividers $9_1$ to $9_{N-1}$ is adjusted in such a way that the signal power at each end node of the optical waveguide 11 or at each of the plurality of the track-and-hold-units $7_1$, $7_2$ to $7_N$ is approximately the same. More precisely, the ratio of the signal power of all N−1 optical power dividers $9_1$ to $9_{N-1}$ can be adjusted in such a way that the signal power should be the same at the input port of the plurality of the opto-electronic flip-flops $12_1$, $12_2$ to $12_N$, wherein the opto-electronic flip-flops $12_1$, $12_2$ to $12_N$ are integrated within the track-and-hold-units $7_1$, $7_2$ to $7_N$ or wherein the opto-electronic flip-flops $12_1$ to $12_N$ are arranged in front of the track-and-hold-units $7_1$, $7_2$ to $7_N$, i.e. upstream in the signal path.

FIG. 2 describes a symmetrical tree-structure of the optical waveguide 11. This means that the depth of all branches of the tree-structure is the same, wherein the tree-structure comprises all descendants of the first optical power divider $9_1$. The descendants comprise the further optical power dividers $9_2$ to $9_{N-1}$ as well as the plurality of the delay units $10_1$, $10_2$ to $10_M$. The descendants are connected to the first branch or the second branch of the first optical power divider $9_1$. The first optical power divider $9_1$ is thereby connected to the second input port 5. In the embodiment of FIG. 2 the depth of the tree-structure is three.

Furthermore, the number of the delay units $10_1$ to $10_M$ arranged within a second branch of every optical power divider $9_1$ to $9_{N-1}$ equals the number of the track-and-hold-units $7_1$, $7_2$ to $7_N$ that are connected as descendants to the respective branch. For example, the second branch of the first optical divider $9_1$ comprises four delay units $10_1$. This is indicated by the number "4" before $\Delta t$. However, the second branch of the first optical divider $9_1$ is connected to four track-and-hold-units $7_1$, $7_2$ to $7_N$ at the end. The same also applies to the second branch of the second optical divider $9_2$. The second branch of the second optical divider $9_2$ is connected to two track-and-hold-units $7_1$, $7_2$ to $7_N$, which means that two delay units $10_2$ are incorporated within the second branch of the second optical power divider $9_2$.

A branch is a line segment of the optical waveguide 11 that extends from the output of each of the optical power dividers $9_1$ to $9_{N-1}$ and ends at the input of the descendant optical power divider $9_1$ to $9_{N-1}$ or at the input port of the opto-electronic flip-flop $12_1$ to $12_N$ or at the input port of the track-and-hold-unit $7_1$, $7_2$ to $7_N$. Into each branch a delay unit $10_1$ to $10_M$ can be incorporated. According to one embodiment, as described in detail below, the delay unit $10_1$ to $10_M$ is an integral part of the optical waveguide 11 having a special wiring.

In the embodiment of FIG. 2 according to the present invention no delay units $10_1$ to $10_M$ are arranged within the first branch of every optical power divider $9_1$ to $9_{N-1}$. It is clear that the optical clock signal, which is fed to the first track-and-hold-unit $7_1$, is only delayed by the length of the optical waveguide 11 from the second input port 5 to the respective input port of the opto-electronic flip-flop $12_1$ of the first track-and-hold-unit $7_1$. However, the optical clock signal of the second track-and-hold-unit $7_2$ is delayed by one delay unit by a period $\Delta t=1/(Nf_{clk})$. If the period has a length of 100 ps the optical clock signal for the second track-and-hold-unit $7_2$ is delayed by 12.5 ps. It is also clear that the clock signal for the third track-and-hold-unit $7_3$ is delayed by 25 ps compared to the clock signal fed to the first track-and-hold-unit $7_1$.

By way of example, when calculating the division ratio of the optical power dividers $9_1$ to $9_{N-1}$, the amount of the descendant branches have to be taken into account comprising the amount of the descendant delay units $9_1$ to $9_{N-1}$. For example, the first branch of the first optical power divider $9_1$ comprises four descendant delay units $10_1$ to $10_M$, wherein the second branch of the first optical power divider $9_1$ comprises eight delay units $10_1$ to $10_M$. Putting all this information together, the division ratio of all the optical power dividers $9_1$ to $9_{N-1}$ can be calculated, so that the input signal level is the same for all of the plurality of the opto-electronic flip-flop $12_1$ to $12_N$ or for the plurality of the track-and-hold-units $7_1$, $7_2$ to $7_N$.

By way of further example, the tree-structure described above can also be brought forward to a sampling device 2 having more or less track-and-hold-units $7_1$, $7_2$ to $7_N$ than shown in FIG. 2.

By way of further example, other tree-structures may be applied that are not symmetrical. However, all tree-structures have in common that the root-node is connected to the second input port 5 and that a plurality of end-nodes are connected to the plurality of the track-and-hold-units $7_1$, $7_2$ to $7_N$ or to the plurality of the opto-electronic flip-flops $12_1$ to $12_N$. The at least one delay unit $10_1$ to $10_M$ delays the optical clock signal in such a manner that each of the plurality of the track-and-hold-units $7_1$, $7_2$ to $7_N$ captures a part of the RF (radio frequency)-input-signal at a different time.

As already mentioned, other tree-structures for the optical waveguide 11 can also be used. For example, the N−1 optical power dividers $9_1$ to $9_{N-1}$ can be connected in series so that each optical power divider $9_1$ to $9_N$ is connected to the second branch of a respective parent optical power divider $9_1$ to $9_{N-1}$, wherein the first optical power divider $9_1$ is connected to the second input port 5 and wherein the first branch of each of the N−1 optical power dividers $9_1$ to $9_{N-1}$ is connected to the respective track-and-hold-unit $7_1$, $7_2$ to $7_N$. Such a structure is shown in FIG. 1 for example.

Furthermore, in the embodiment of FIG. 2, one delay unit $10_1$ to $10_M$ is arranged within the second branch of each of the N−1 optical power dividers $9_1$ to $9_{N-1}$. This kind of tree-structure can preferably be used if the number of the track-and-hold-units $7_1$, $7_2$ to $7_N$ is small. Thus, the division ratio within the first optical power divider $9_1$ can easily be adjusted. However, if there are, for example, 32 track-and-hold-units $7_1$, $7_2$ to $7_N$ the first optical power divider $9_1$ should have a division ratio of at least 1:32 which is difficult to obtain.

The plurality of the track-and-hold-units $7_1$, $7_2$ to $7_N$ are connected to the plurality of amplifiers $13_1$ to $13_N$, wherein the output of the plurality of the amplifiers $13_1$ to $13_N$ is, for example, also the output of the chip.

Figure 3:
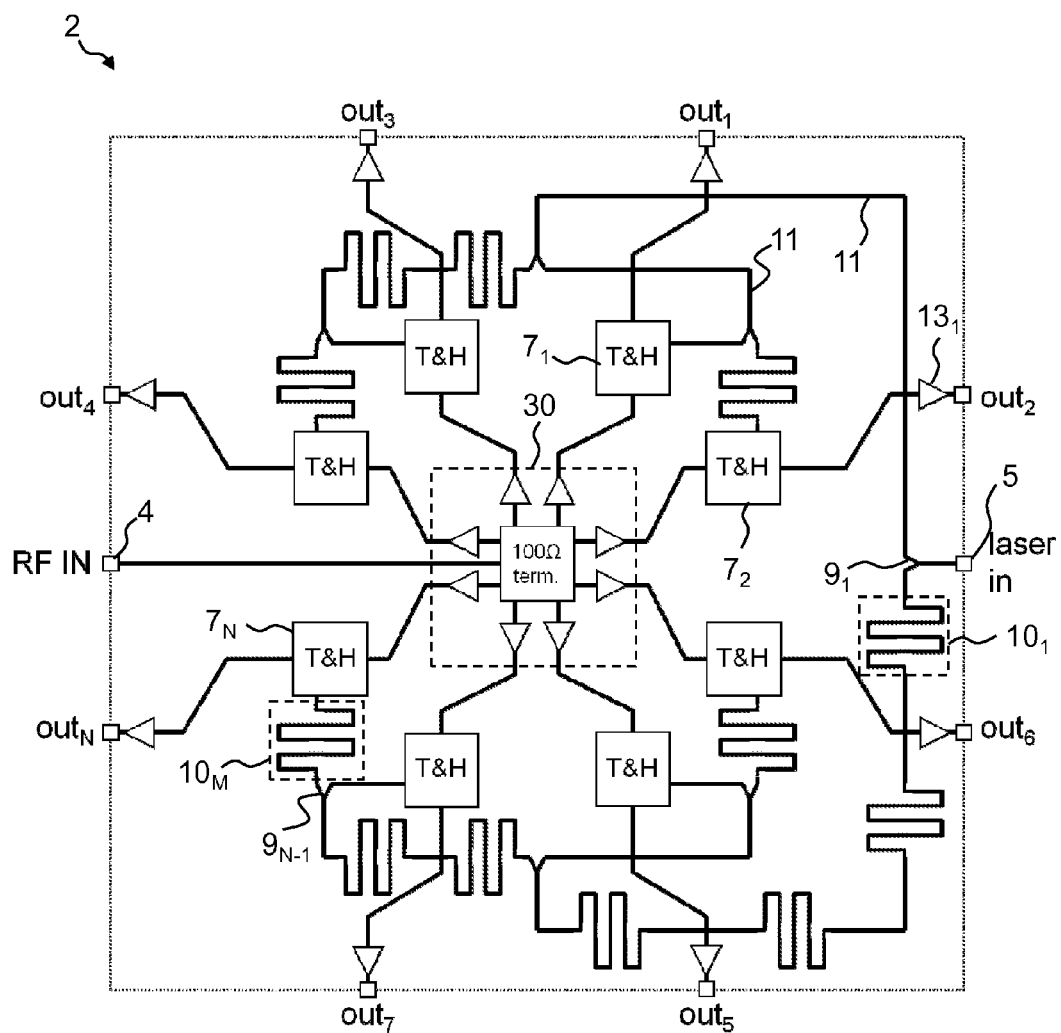
FIG. 3 illustrates a simplified layout of the sampling device according to an example embodiment of the present invention.

FIG. 3 shows a simplified layout of the sampling device 2 according to an embodiment of the present invention. As already mentioned an RF-signal is fed to the first input port 4. Within an RF-distribution circuit 30, the RF-signal is split into N individual signals which are fed to the plurality of the track-and-hold-units $7_1$, $7_2$ to $7_N$. The RF-distribution circuit 30 comprises several amplifiers 6 for amplifying each of the individual RF-signals. It should be noted that the RF-distribution circuit 30 is matched with respect to the first input port 4.

Furthermore, as already described, an optical clock signal is fed to the second input port 5. This optical clock signal may be generated by a mode locked laser 8. The optical clock signal is then split up by a first optical power divider $9_1$ which is part of the optical waveguide 11.

In order to simplify the arrangement, the plurality of opto-electronic flip-flops $12_1$ to $12_N$ which transform an optical clock signal into an electrical clock signal are not shown within FIG. 3.

The plurality of the delay units $10_1$ to $10_M$ are also shown within the layout of FIG. 3. The delay units $10_1$ to $10_M$ which are part of the optical waveguide 11 have the shape of a meander. It has to be noted that the corners of the meander of the delay units $10_1$ to $10_M$ are illustrated disproportionately. As described below, the meander structure has only round segments which connect the parallel segments to each other. The meander structure thereby increases the light length with respect to the typically straight lines of the optical waveguide 11. It can clearly be seen that the optical clock signal for the first track-and-hold-unit $7_1$ does not travel through any delay unit $10_1$ to $10_M$. The optical clock signal for the last track-and-hold-unit $7_N$ travels through N−1 delay units $10_1$ to $10_M$.

If the clock signal has a period of 100 ps, for example, each output port is delayed to the respective adjacent output port by 12.5 ps. Because a mode locked laser has a very good jitter performance, the difference between the delay times of each output port is constant.

Figure 4:
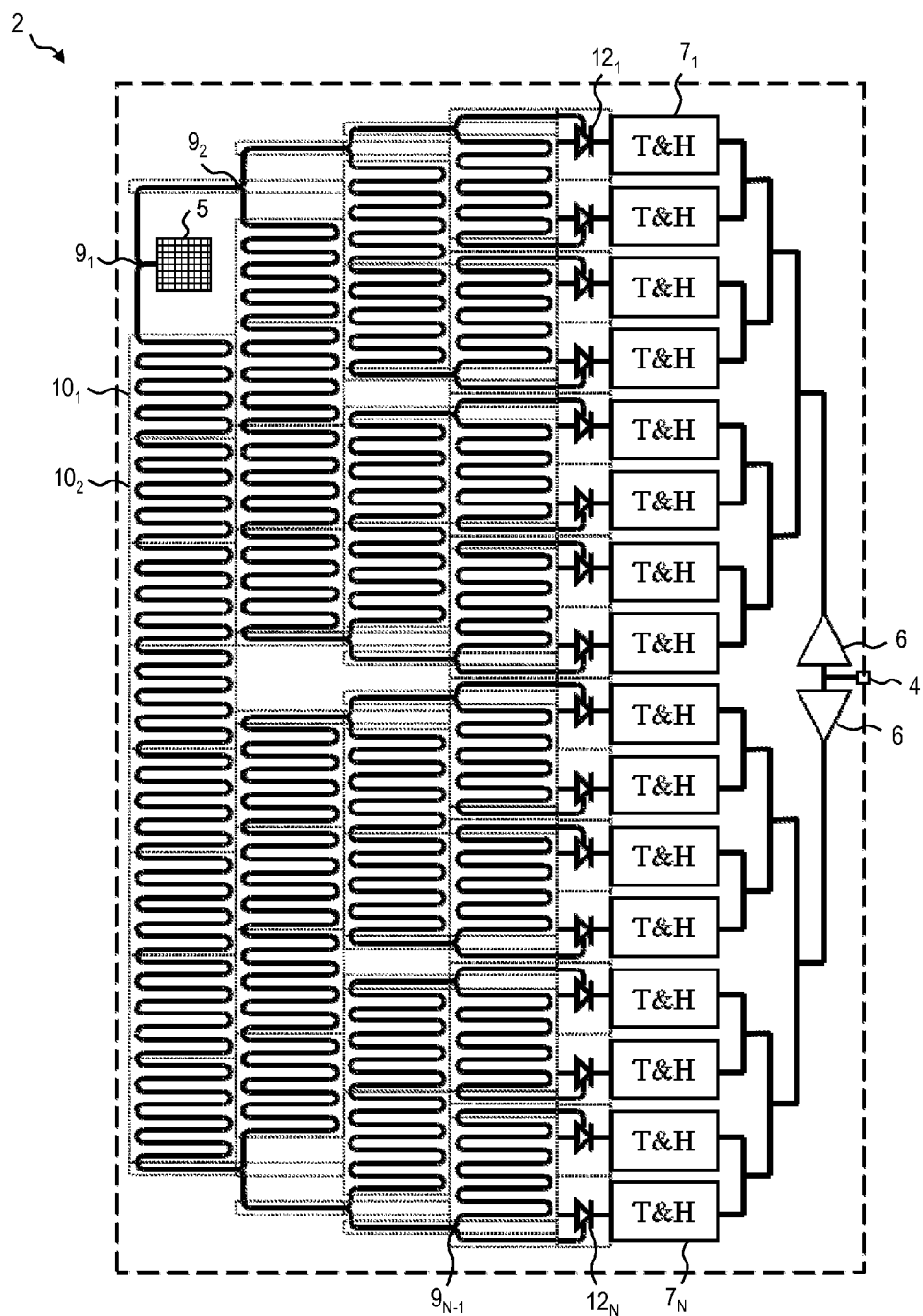
FIG. 4 illustrates a simplified layout of the sampling device according to another example embodiment of the present invention.

FIG. 4 shows a simplified layout of the sampling device 2 according to another embodiment of the invention. The interleaving factor N is higher in FIG. 4 compared to the interleaving factor in FIG. 2. The interleaving factor N equals 16 so that there are also 16 track-and-hold-units $7_1$, $7_2$ to $7_N$. It can also be seen that an RF-signal is fed to the first input port 4. The RF-signal is then split into two signal paths, wherein each signal path comprises an amplifier 6. Each signal path is then further split, so that a part of the RF-signal which is fed to the first input port 4 also applies at the input port of each of the plurality of the track-and-hold-units $7_1$, $7_2$ to $7_N$.

FIG. 4 also shows the second input port 5 which is connected through an optical fiber to the mode locked laser 8. The input port 5 consists of a grating, which couples the incident light into the optical waveguide 11. This ensures that as much power of the light pulses as possible can be injected into the optical waveguide 11. Other forms which also reduce the power loss of the optical clock signal at the second input port 5 are also suitable.

As already described, the optical waveguide 11 is split by first optical power divider $9_1$ into a first branch and a second branch. As already described, a plurality of delay units $10_1$ to $10_M$ are formed within the optical waveguide 11. Each delay unit $10_1$ to $10_M$ is separated from the adjacent delay unit $10_1$ to $10_M$ as indicated by a dotted line. The number of the delay units $10_1$ to $10_M$ which are arranged within the second branch of the first optical power divider $9_1$ also equals the number of the track-and-hold-units $7_1$, $7_2$ to $7_N$ that are connected as descendants to the respective branch. In this case eight track-and-hold-units $7_1$, $7_2$ to $7_N$ are connected as descendants to the second branch of the first optical power divider $9_1$. Thus, there are eight delay units inserted within the second branch. The same also applies for example for the second optical power divider $9_2$. In this case there are four track-and-hold-units $7_1$, $7_2$ to $7_N$ that are connected to the second branch of the second optical divider $9_2$. Therefore, the second branch of the second optical power divider $9_2$ comprises four delay units $10_1$ to $10_M$. On the other hand, as already mentioned, the first branch of every optical power divider $9_1$ to $9_{N-1}$ does not comprise any delay unit $10_1$ to $10_M$.

FIG. 4 also shows the plurality of the opto-electronic flip-flops $12_1$ to $12_N$. Each of the opto-electronic flip-flops $12_1$ to $12_N$ is arranged at an input port of a track-and-hold-units $7_1$, $7_2$ to $7_N$. Each opto-electronic flip-flop $12_1$ to $12_N$ transforms an optical clock signal to an electronic clock signal that is fed to the respective track-and-hold-unit $7_1$, $7_2$ to $7_N$. According to one embodiment, the optical clock signal has about the same power level at every opto-electronic flip-flop $12_1$ to $12_N$. This is achieved by a suitable angle between the first and the second branch of each of the optical power dividers $9_1$ to $9_{N-1}$ with respect to the input port of the optical power divider $9_1$ to $9_{N-1}$.

Figure 5A:
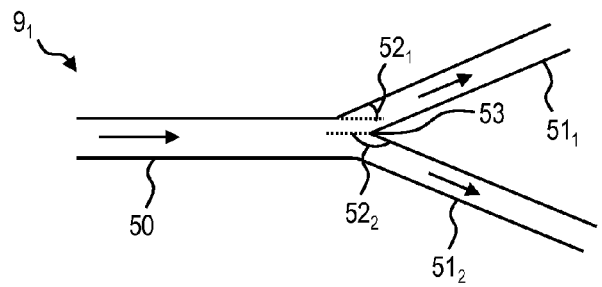
FIG. 5A illustrates an optical power divider according to an example embodiment of the present invention.

FIG. 5A shows a simplified embodiment of the optical power divider $9_1$ to $9_{N-1}$, according to an example embodiment of the present invention. It can be seen that the optical power divider $9_1$ to $9_{N-1}$ has one incoming signal line 50 which is part of the optical waveguide 11. The incoming signal line 50 is split into a first branch $51_1$ and a second branch $51_2$. By way of example, the ratio of the signal power at each branch $51_1$, $51_2$ can be selected by adjusting the divergence angle $52_1$ of the first branch and the divergence angle $52_2$ of the second branch $51_2$ with respect to the incoming signal line 50 of the optical power divider $9_1$ to $9_{N-1}$. If the starting point of the first branch $51_1$ and the second branch $51_2$ is in the middle of the incoming signal line and if both divergence angles are 45°, the optical power divider $9_1$ to $9_{N-1}$ divide the optical clock signal into two clock signals both having the same signal power level.

Furthermore, by way of further example, a corner 53 which connects the first branch $51_1$ to the second branch $51_2$ can be slid along the width of the incoming signal line 50 to further adjust the division ratio which allows building optical power dividers $9_1$ to $9_{N-1}$ that have a very high division ratio of for example 1:30 or above. Those kind of optical power dividers $9_1$ to $9_{N-1}$ can be used if an asymmetrical tree-structure of the optical waveguide 11 should be realized.

By way of further example, the first branch $51_1$ and the second branch $51_2$ shown in the embodiment of FIG. 5A have a smaller width than the incoming signal line 50. It should be clear that the first branch $51_1$ and the second branch $51_2$ can also have a width that equals the width of the incoming signal line 50 or they can have a width that is larger than the one of the incoming signal line 50.

As already mentioned, the incoming signal line 50 as well as the first branch $51_1$ and the second branch $51_2$ of each optical power divider $9_1$ to $9_{N-1}$ are part of the optical waveguide 11 and are, for example, made of a transparent layer of germanium or $SiO_2$. The optical power divider $9_1$ to $9_{N-1}$ as well as the whole optical waveguide 11 can easily be structured on a common wafer. Furthermore it is also possible to create an optical power divider that has more than two branches.

Figure 5B:
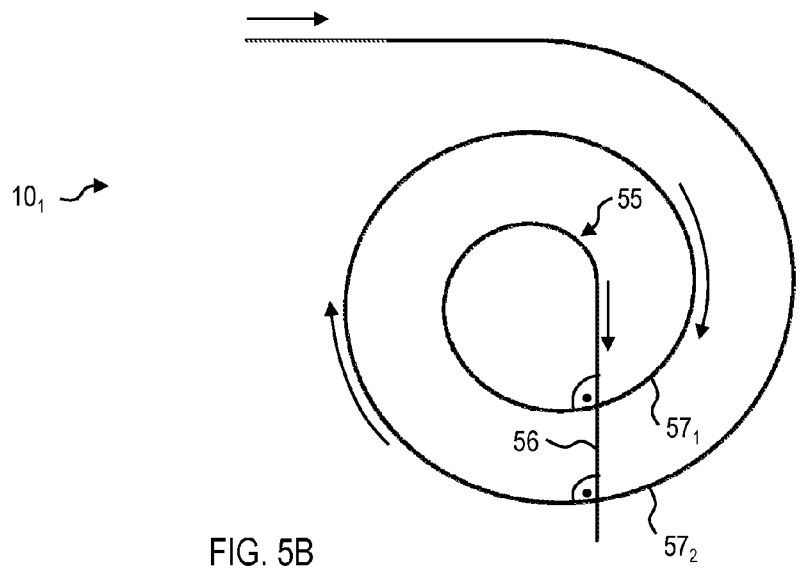
FIG. 5B illustrates an optical waveguide operating as delay unit according to an example embodiment of the present invention.

FIG. 5B shows an embodiment of a part of an optical waveguide 11 operating as delay unit $10_1$ to $10_M$ according to an example embodiment of the present invention. Within FIG. 3 and FIG. 4 it is shown that the delay unit $10_1$ to $10_M$ is part of the optical waveguide 11 and that this part of the optical waveguide 11 has the shape of a meander. However, the delay units $10_1$ to $10_M$ can also have the shape of a spiral, wherein an inner segment 55 of the delay unit $10_1$ to $10_M$ is lead to the outside by using a straight line 56 thereby crossing the other segments $57_1$, $57_2$ at an angle of about 90°. An angle of approximately 90° ensures that the delayed clock signal on the straight line 56 does not interfere with the more or less delayed clock signals on the other segments $57_1$, $57_2$. As already mentioned it has to be assured that no corners are used.

By way of example, the larger the radius of all parts of the spiral shaped delay units $10_1$ to $10_M$ is, the more can the loss of the optical power be reduced.

Figure 5C:
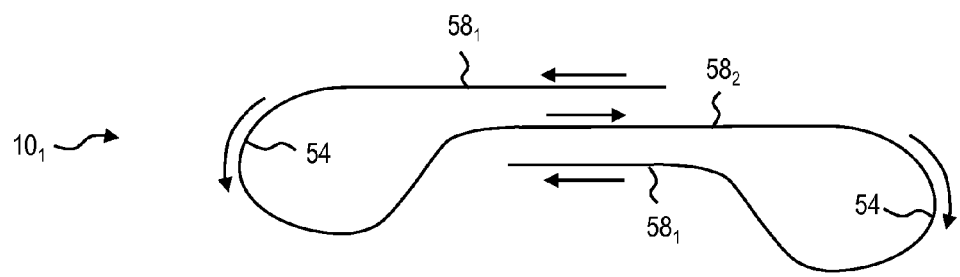
FIG. 5C illustrates an optical waveguide operating as delay unit according to a further example embodiment of the present invention.

FIG. 5C shows another embodiment of an optical waveguide 11 operating as a delay unit $10_1$ to $10_M$ according to an example embodiment of the present invention. As mentioned above, the delay unit $10_1$ to $10_M$ can have the shape of a meander, wherein the delay unit $10_1$ to $10_M$ has segments $58_1$, $58_2$ that are parallel to each other and wherein the delay unit $10_1$ to $10_M$ has other segments 54 that are round, thereby connecting the parallel segments $58_1$, $58_2$ to each other. By way of example, the radius of the other segments 54 can be equal to the distance between the two parallel segments $58_1$, $58_2$ as shown in FIG. 4. However, for example, the diameter of the other segments can also be larger than the distance between the two parallel segments $58_1$, $58_2$ as shown in FIG. 5C. If the other segment 54 has a radius that is larger than the distance between the two parallel segments, the optical power loss is further reduced.

Figure 6:
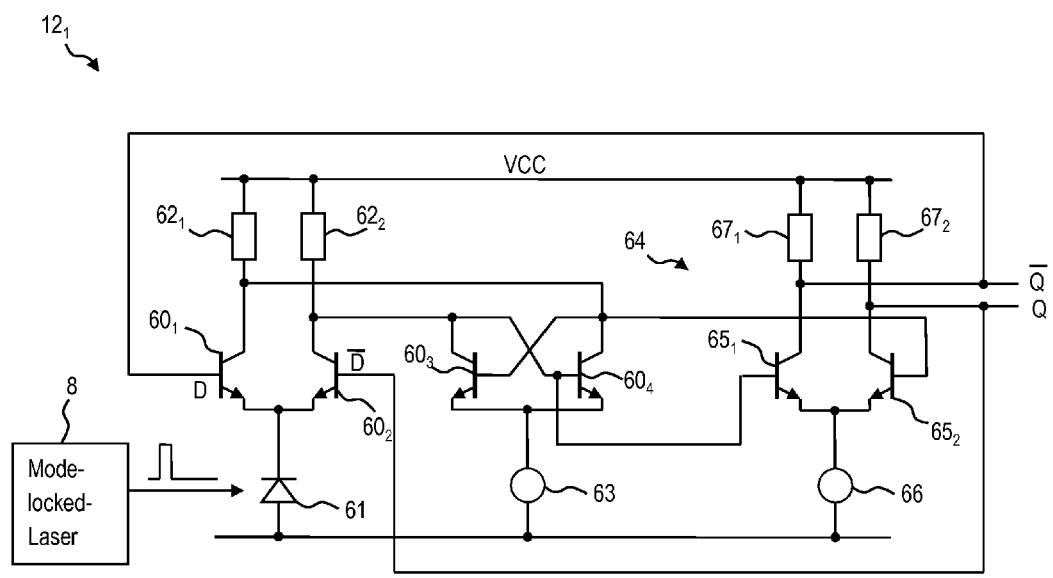
FIG. 6 illustrates an opto-electronic flip-flop used as an electronic clock generator according to an example embodiment of the present invention.

FIG. 6 shows an embodiment of an opto-electronic flip-flop $12_1$ to $12_N$ that can be used as an electronic clock generator, according to an example embodiment of the present invention. The opto-electronic flip-flop $12_1$ to $12_N$ comprises several transistors $60_1$, $60_2$, $60_3$, $60_4$. The emitters of the transistors $60_1$, $60_2$ are connected to a photodiode 61, which, for its part, is connected to a negative supply voltage, which can also be connected to ground. Data inputs D and $\overline{D}$ are connected to the base terminals of the transistors $60_1$, $60_2$. The collectors of the transistors $60_1$, $60_2$ are each connected by means of a resistor $62_1$, $62_2$ to a positive supply voltage.

By way of example, the photodiode 61 in this circuit is connected in such a manner that only minimal leakage current flows, as long as no light falls on the photodiode 61. As soon as light falls onto the photodiode 61, a photocurrent passes from an n-doped to a p-doped region of the photodiode. The intensity of the photocurrent is, in a good approximation, proportional to the luminous power of the laser pulse.

FIG. 6 shows also a differential pair of transistors $60_3$, $60_4$ which form a latch. The base terminals of this differential pair are connected crosswise to the collector terminals of the transistors $60_1$, $60_2$. That is to say, the base terminal of the transistor $60_3$ is connected to the collector terminal of the transistor $60_1$. The base terminal of the transistor $60_4$ is connected to the collector terminal of the transistor $60_2$. Moreover, the collector terminal of the transistor $60_3$ is connected to the collector terminal of the transistor $60_2$. The collector terminal of transistor $60_4$ is also connected to the collector terminal of transistor $60_1$. The emitter terminals of the transistors $60_3$, $60_4$ are connected via a current source 63 to a negative supply voltage, which can also be connected to ground. As a result of the crosswise wiring, a positive feedback is generated, and accordingly, the logical status of the latch is maintained. In this context, the zero-signal current of the latch generated by the current source 63 is significantly smaller than the photocurrent which is generated by the photodiode 61. Only if this condition is fulfilled, can the photocurrent of the photodiode 61 exceeds the zero-signal current of the current source 63 and accordingly varies the logical status of the latch.

By way of further example, the optically controlled D-flip-flop, also called the opto-electronic flip-flop $12_1$, $12_2$ to $12_N$, illustrated here can be used for a plurality of applications. In particular, it is suitable for use in a high-precision clock generator that can be used i.e. within a sampling device 2 according to the present invention. In order to generate an electrical clock signal, of which the clock statuses provide the same length (duty cycle 50%), a feedback loop has also to be implemented.

FIG. 6 shows also a delaying device 64. The delaying device 64 comprises two transistors $65_1$, $65_2$, a current source 66 and two resistors $67_1$, $67_2$. The two resistors $67_1$, $67_2$ are each connected between a positive supply voltage and the collector of one of the transistors $65_1$, $65_2$ as load resistors. The emitters of the transistors $65_1$, $65_2$ are each connected to the current source 66, which is connected to a negative supply voltage, which can also be connected to ground. The base of the transistor $65_1$ is connected to the base of the transistor $60_4$. The base of the transistor $65_2$ is connected to the base of the transistor $60_3$. Moreover, the collector of the transistor $65_1$ is connected to the base of the transistor $60_1$ as a feedback. Similarly, the collector of the transistor $65_2$ is connected to the base of the transistor $60_2$.

Figure 7:
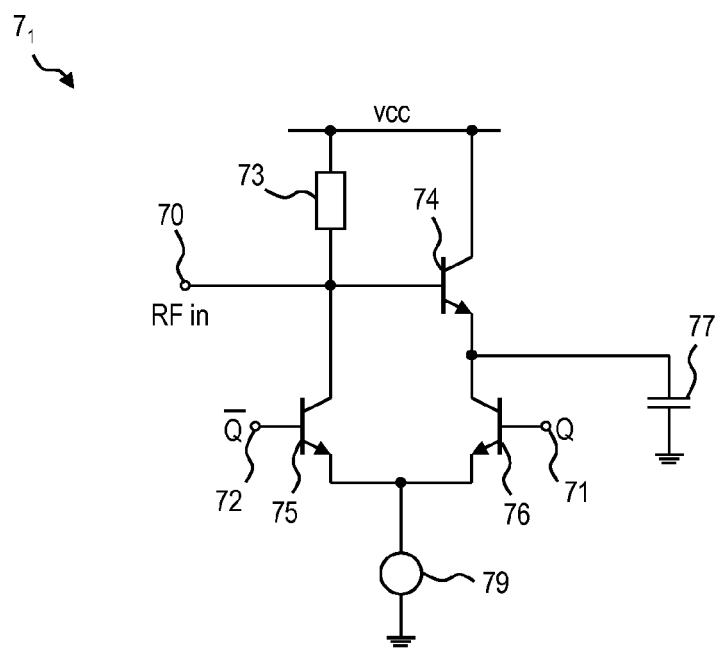
FIG. 7 illustrates a simplified track and hold unit according to an example embodiment of the present invention.

FIG. 7 shows an embodiment of a simplified track-and-hold-unit $7_1$, $7_2$ to $7_N$, according to an example embodiment of the present invention. It can be seen that the simplified track-and-hold-unit $7_1$, $7_2$ to $7_N$ has three input ports. An RF-signal is fed to the first input port 70, wherein a clock signal is fed to a second input port 71, wherein a clock-not-signal is fed to the third input port 72. The first input port of the track-and-hold-unit $7_1$ to $7_N$ is connected to one end of a resistor 73, wherein the other end of the resistor 73 is connected to a supply voltage. Furthermore, the first input port 70 is also connected to a base of a transistor 74 and to a collector of another transistor 75. The collector of the transistor 74 is also connected to the supply voltage. The emitter of the transistor 74 is connected to a collector of a further transistor 76 and to one end of a capacitor 77, wherein the other end of the capacitor 77 is connected to a supply voltage that can be ground for example. The base of the further transistor 76 is connected to the second input port 71 of the simplified track-and-hold-unit $7_1$ to $7_N$, wherein the base of the other transistor 75 is connected to the third input port 72 of the simplified track-and-hold-unit $7_1$ to $7_N$. The emitters of the other transistor 75 and the further transistor 76 are connected together and to a current source 79.

By way of further example, however, instead of connecting the third input port 72 of the simplified track-and-hold-unit $7_1$ to $7_N$ to a clock-not-signal, the third input port 72 can also be connected to a constant voltage source, if the voltage is lower than the logic "high" level of the electric clock signal and higher than the logic "low" level of the electrical clock signal, wherein the electrical clock signal is fed to the second input port 71. Otherwise, a clock-not-signal can be input to the third input port 72 too, wherein the clock-not-signal has a phase shift of 180° with respect to the electrical clock signal which is input to the second input port 71. If the logic level of the electrical clock signal is "high", the further transistor 76 is in a conducting state. Thus, the capacitor 77 is charged with a part of the RF-signal, wherein the part equals the RF-signal minus the voltage UBE of the transistor 74. If the logic level of the electrical clock signal is "low" at the second input port 71 of the simplified track-and-hold-unit $7_1$ to $7_N$, the other transistor 75 is in a conducting state which ensures that the transistor 74 is not in a conducting state. The resistor 73 enhances this effect.

Figure 8:
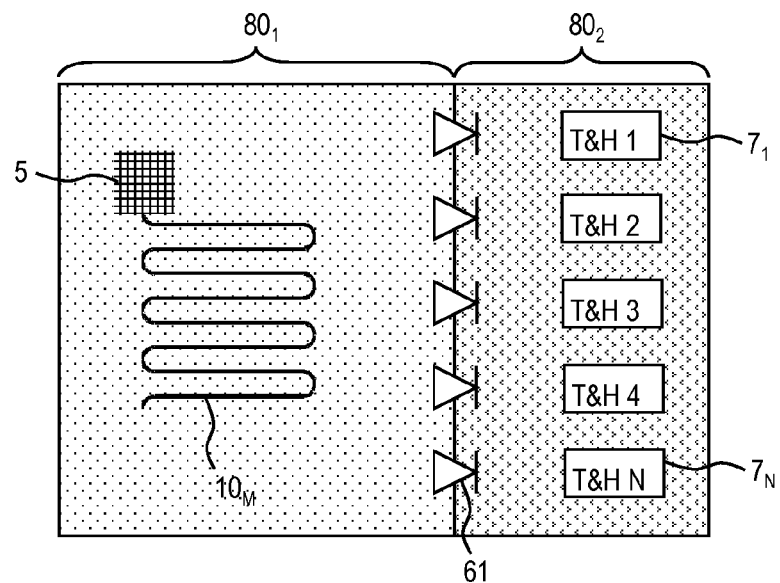
FIG. 8 illustrates a simplified chip structure carrying the sampling device according to an example embodiment of the present invention.

FIG. 8 shows an embodiment of a chip structure carrying the sampling device 2 according to an example embodiment of the present invention. By way of example, the chip comprises a silicon wafer as a ground structure. Furthermore, the optical waveguide 11 comprising the optical power splitters $9_1$ to $9_{N-1}$ and the delay units $10_1$ to $10_M$ are arranged on a first part $80_1$ of the wafer. By way of further example, the optical waveguide 11 together with the aforementioned components are made of a layer which is transparent for the respective wavelength of the light source, i.e. germanium or $SiO_2$. It should be mentioned that other materials that can be deposited on a wafer and that have a transparent structure can be used as well for creating the optical waveguide 11.

On the other side the plurality of the track-and-hold-units $7_1$ to $7_N$ and the opto-electronic flip-flops $12_1$ to $12_N$ are arranged on a second part $80_2$ of the wafer. By way of example, the photodiode 61 within the opto-electronic flip-flop $12_1$ to $12_N$ may be arranged at the changeover between the first part $80_1$ and the second part $80_2$ of the wafer. By way of further example, the components of the second part $80_2$ may be made of SiGe. It should be clear that other materials can be used as well if they can be deposited on a wafer and if they are suitable for high-speed data rates.

By way of further example, instead of using the optical delay units $10_1$ to $10_M$ it is also possible to delay the electrical RF-signal which is input at the first input port 4. This could be done, for example, in a limited range by a proper insertion of varactors, for example by insertion of voltage-dependent capacitors.

The invention is not restricted to the exemplary embodiment presented. All of the features described above or illustrated in the drawings can be advantageously combined with one another as required within the scope of the invention. Other transistors, such as PNP bipolar transistors, NMOS or PMOS transistors or even other FET transistors can be used instead of NPN transistors. Other light sources instead of a mode locked laser can be used, such as stroke lamps, LEDs or other kind of lasers, such as semiconductor lasers. A semiconductor laser might be integrated on the same chip if layers of a III-V-semiconductor, such as InGaAs is applied on the Si-substrate by MBE for example.

Accordingly, In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An apparatus comprising:
   a first input port and a second input port, wherein the first input port is configured to receive an input signal and wherein the second input port is configured to receive an optical clock signal; and
   a plurality of track and hold units, wherein each of the plurality of track and hold units is connected to the first input port, and wherein the plurality of track and hold units are connected to the second input port through an optical waveguide in such a manner that the plurality of track and hold units are configured to operate in a time-interleaved mode; and
   wherein the optical waveguide is arranged in a tree-structure, wherein a root-node is connected to the second input port and each of a plurality of end-nodes is connected to a respective one of the track and hold units, and wherein the optical waveguide comprises at least one delay unit configured to delay the optical clock signal in a manner whereby each of the plurality of track and hold units captures the input signal at a different time,
   wherein the optical waveguide comprises N−1 optical power dividers, wherein N is the number of the plurality of the track and hold units, and wherein each optical power divider splits the optical waveguide into a first branch and a second branch, and
   wherein the N−1 optical power dividers are arranged in series in a manner whereby each optical power divider is connected to the second branch of a respective previous optical power divider, and the first optical power divider is connected to the second input port and the first branch of the N−1 optical power dividers is connected to a respective track and hold unit.

2. The apparatus according to claim 1, wherein each delay unit is configured to delay the optical clock signal by a period $\Delta t = 1/(Nf_{clk})$, wherein N is the number of the plurality of the track and hold units and $f_{clk}$ is the frequency of the optical clock signal.

3. The apparatus according to claim 1, wherein each delay unit has a shape of a meander.

4. The apparatus according to claim 1, wherein each delay unit comprises segments that are parallel to each other, and other segments that connect the parallel segments to each other, wherein each of the other segments is of a rounded shape having a diameter-like dimension that is equal to or larger than the distance between the respective parallel segments that the other segment connects.

5. The apparatus according to claim 1, wherein each delay unit is of a shape of a shape of a spiral, wherein an inner segment of the delay unit is lead to an outside within a straight line and crosses other segments of the spiral at an angle of about 90 degrees.

6. The apparatus according to claim 1, wherein a ratio of a signal power at each branch is selectable based on an adjustment of a divergence angle of the first branch and of a divergence angle of the second branch with respect to an incoming signal line of the optical power divider.

7. The apparatus according to claim 6, wherein the ratio of the signal power of all N−1 optical power dividers is adjustable in a manner whereby the signal power at each end-node or at each of the plurality of track and hold units is approximately the same.

8. The apparatus according to claim 1, wherein a one of the delay units is arranged within the second branch of each of the N−1 optical power dividers.

9. The apparatus according to claim 1, wherein the apparatus is arranged in accordance with one or more of the following:
a depth of all branches of the tree-structure comprising all descendants of the first optical power divider is approximately the same;
the number of delay units arranged within the second branch of each optical power divider equals the number of the track and hold units that are arranged as descendants to that respective branch; and
the first branch of each optical power divider excludes any delay units.

10. The apparatus according to claim 1, wherein the N−1 optical power dividers are arranged in a structure of a binary tree, wherein a root is located at the second input port and wherein N terminal branches respectively connect to the N track-and-hold units.

11. The apparatus according to claim 1, wherein the apparatus further comprises a plurality of opto-electronic flip-flops, wherein each of the plurality of the opto-electronic flip-flops is configured to transform the optical clock signal into an electrical clock signal, and wherein each of the plurality of the opto-electronic flip-flops connects a respective one of the track and hold units to the optical waveguide.

12. The apparatus according to claim 11, wherein the apparatus is configured to operate in one or more of the following manners:
each of the plurality of track and hold units captures a part of the input-signal at a rising or falling edge of the respective optical clock signal or the respective transformed electrical clock signal for the duration of one clock period; and
the maximum frequency of the optical clock signal is equal to a maximum sampling frequency of a plurality of analog/digital-converters, wherein each of the analog/digital-converters is connected to one of the plurality of the track and hold units.

13. The apparatus according to claim 1, wherein the apparatus is configured in one or more of the following manners:
the optical waveguide is made of a layer of germanium or $SiO_2$;
the optical waveguide, the optical power dividers and the delay units are made of germanium or $SiO_2$ and are arranged on a first part of a wafer;
the apparatus further comprises a plurality of opto-electronic flip-flops, wherein each of the plurality of the opto-electronic flip-flops is configured to transform the optical clock signal into an electrical clock signal, and wherein each of the plurality of the opto-electronic flip-flops connects a respective one of the track and hold units to the optical waveguide, and the plurality of track and hold units and the opto-electronic flip-flops are made of SiGe heterojunction bipolar transistors and are arranged on a second part of the wafer, and each of the opto-electronic flip-flops comprises a photodiode that is arranged between the two parts of the wafer.

14. The apparatus according to claim 1, further comprising a mode locked laser configured to generate the optical clock signal, wherein the mode locked laser is connected with an optical fiber to the second input port.

15. The apparatus according to claim 11, wherein each opto-electronic flip-flop comprises a differential pair of first transistors and two load resistors, wherein each load resistor is arranged between a supply voltage terminal and a collector of a respective first transistor and an emitter of each first transistor is connected to a respective photodiode.

16. The apparatus according to claim 15, wherein each opto-electronic flip-flop comprises a differential pair of second transistors and a first current source, and wherein the first current source is arranged between emitters of the second transistors, base terminals of the second transistors are connected crosswise to collectors of the second transistors, and the collector of each second transistor is connected to a collector of a respective one of the first transistors.

17. The apparatus according to claim 16, wherein each opto-electronic flip-flop comprises a differential pair of third transistors, two load resistors and a second current source, and wherein each load resistor is arranged between a supply voltage terminal and a collector of a respective one of the third transistors, emitters of the third transistors are connected to the second current source (66), and a base terminal of each third transistor is connected to at least one output of the opto-electronic flip-flops.

18. An apparatus comprising:
a first input port and a second input port, wherein the first input port is configured to receive an input signal and wherein the second input port is configured to receive an optical clock signal;
a plurality of track and hold units, wherein each of the plurality of track and hold units is connected to the first input port, and wherein the plurality of track and hold units are connected to the second input port through an optical waveguide in such a manner that the plurality of track and hold units are configured to operate in a time-interleaved mode; and
a plurality of opto-electronic flip-flops, wherein each of the plurality of the opto-electronic flip-flops is configured to transform the optical clock signal into an electrical clock signal, and wherein each of the plurality of the opto-electronic flip-flops connects a respective one of the track and hold units to the optical waveguide; and
wherein each opto-electronic flip-flop comprises a differential pair of first transistors and two load resistors, wherein each load resistor is arranged between a supply voltage terminal and a collector of a respective first transistor and an emitter of each first transistor is connected to a respective photodiode.

19. The apparatus according to claim 18, wherein each opto-electronic flip-flop comprises a differential pair of second transistors and a first current source, and wherein the first current source is arranged between emitters of the second transistors, base terminals of the second transistors are connected crosswise to collectors of the second transistors, and the collector of each second transistor is connected to a collector of a respective one of the first transistors.

20. The apparatus according to claim 19, wherein each opto-electronic flip-flop comprises a differential pair of third transistors, two load resistors and a second current source, and wherein each load resistor is arranged between a supply voltage terminal and a collector of a respective one of the third transistors, emitters of the third transistors are connected to the second current source (66), and a base terminal of each third transistor is connected to at least one output of the opto-electronic flip-flops.

* * * * *